United States Patent
Shi et al.

(10) Patent No.: US 8,457,261 B1
(45) Date of Patent: Jun. 4, 2013

(54) AUTOMATIC GAIN CONTROL TECHNIQUES FOR DETECTING RF SATURATION

(75) Inventors: Kai Shi, Sunnyvale, CA (US); Ning Zhang, Saratoga, CA (US)

(73) Assignee: QUALCOMM Incorporated, San Diego, CA (US)

( * ) Notice: Subject to any disclaimer, the term of this patent is extended or adjusted under 35 U.S.C. 154(b) by 763 days.

(21) Appl. No.: 12/706,932

(22) Filed: Feb. 17, 2010

(51) Int. Cl.
H04L 27/08 (2006.01)
(52) U.S. Cl.
USPC .......................................... 375/345; 375/316
(58) Field of Classification Search
USPC ........................... 375/316, 345, 324, 326, 340
See application file for complete search history.

(56) References Cited

U.S. PATENT DOCUMENTS

| 6,748,200 | B1 * | 6/2004 | Webster et al. ............. 455/234.1 |
| 7,353,010 | B1 * | 4/2008 | Zhang et al. ................ 455/234.1 |
| 7,414,555 | B1 | 8/2008 | Nathawad et al. |
| 7,471,152 | B2 | 12/2008 | Jiang et al. |
| 7,565,124 | B2 * | 7/2009 | Lee et al. .................... 455/234.1 |
| 2003/0181179 | A1 * | 9/2003 | Darabi ........................ 455/234.1 |
| 2008/0200139 | A1 * | 8/2008 | Kobayashi ................. 455/232.1 |

* cited by examiner

Primary Examiner — Emmanuel Bayard
(74) Attorney, Agent, or Firm — DeLizio Gilliam, PLLC

(57) ABSTRACT

Functionality can be implemented for automatic gain control (AGC) in a wireless network device to determine whether to change the gain of the wireless network device based on determining the strength of an RF signal. At various time instants, the strength of the RF signal can be compared against different thresholds to determine the presence of and severity of the saturation of the RF front end. The gain settings can be adjusted based on comparing the strength of the RF signal with a set of thresholds. This can help the wireless network device receive RF signals with little or no distortion, and can minimize RF saturation, gain compression, false detection and other performance degradation at the wireless network device.

23 Claims, 10 Drawing Sheets

AUTOMATIC GAIN CONTROL TECHNIQUES FOR DETECTING RF SATURATION

BACKGROUND

Embodiments of the inventive subject matter generally relate to the field of wireless communications and, more particularly, to automatic gain control techniques for detecting radio frequency (RF) saturation.

Wireless local area network (WLAN) devices typically use radio frequency techniques to exchange WLAN signals. A receiving WLAN device typically establishes a stable signal level before beginning WLAN packet reception. An automatic gain control (AGC) unit in the receiving WLAN device adjusts the gain of an RF front end and other processing units during reception of a WLAN packet preamble to enable proper WLAN packet reception. The AGC unit typically adjusts the gain of the RF front end and other processing units based on analyzing the power of a digitized RF signal at the output of an analog to digital converter (ADC).

SUMMARY

Various embodiments for detecting radio frequency (RF) saturation are disclosed. In one embodiment, a plurality of samples associated with an RF signal received at a wireless network device are determined. The plurality of samples are used to indicate RF saturation in the wireless network device at a plurality of time instants. A number of high amplitude samples are determined in a window of a pre-determined subset of the plurality of samples. Each of the high amplitude samples indicates a presence of RF saturation in the wireless network device at a time instant of the plurality of time instants. The number of high amplitude samples in the window is compared with a plurality of gain thresholds to determine whether to decrease an RF gain associated with the wireless network device. In response to determining to decrease the RF gain associated with the wireless network device, an RF gain drop value is determined based, at least in part, on said comparing the number of high amplitude samples in the window with the plurality of gain thresholds. The RF gain associated with the wireless network device is decreased in accordance with the RF gain drop value.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

Figure 1:
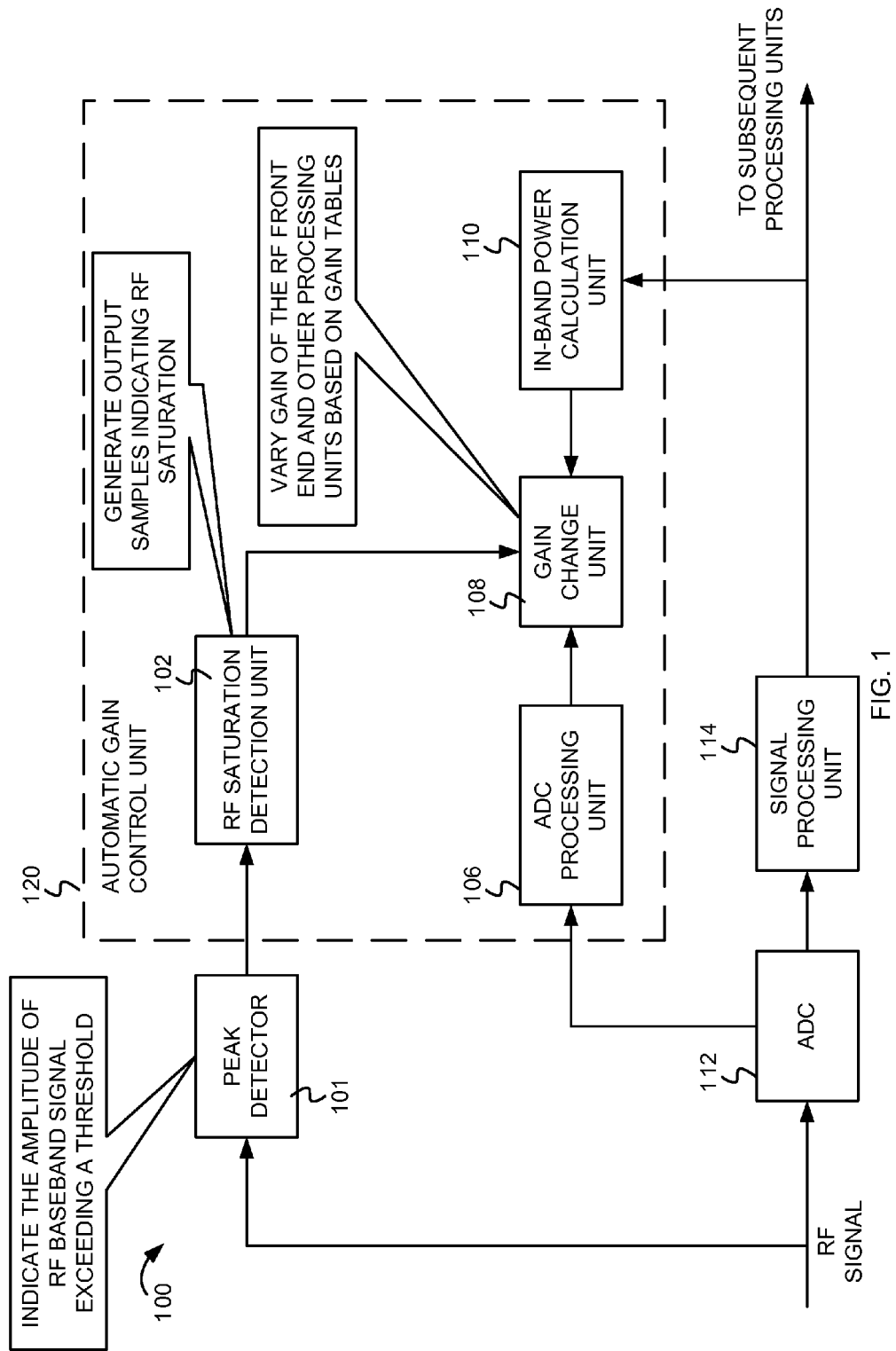
FIG. 1 is an example block diagram illustrating a WLAN receive chain comprising a mechanism for detecting RF saturation and accordingly reducing RF gain.

The description that follows includes exemplary systems, methods, techniques, instruction sequences, and computer program products that embody techniques of the present inventive subject matter. However, it is understood that the described embodiments may be practiced without these specific details. For instance, although examples refer to detecting RF saturation in WLAN devices, in other implementations, RF saturation may be detected in other devices and standards such as Bluetooth®, WiMAX, ZigBee®, Wireless USB devices, etc. In other instances, well-known instruction instances, protocols, structures, and techniques have not been shown in detail in order not to obfuscate the description.

Traditionally, AGC control is performed based on a power of an RF signal at an output of an analog to digital converter (ADC) ("ADC power") and an in-band power. The ADC bandwidth (e.g., 40 to 80 MHz) is much smaller than the RF bandwidth (typically 2.4 GHz or 5 GHz), and thus does not cover the entire RF spectrum. Therefore, the ADC power typically does not provide a good representation of out-of-band signals and a strong interfering out-of-band signal may not be detected in the ADC power or in the in-band power. AGC operations rely on the ADC output to calculate a noise floor and determine gain settings of various components in a receive chain. However, because of the low visibility of the ADC, the strong out-of-band interfering signal may not be taken into consideration while determining the noise floor and the gain settings. Thus, the strong out-of-band interfering signal may cause saturation of an RF front end, which may not be detected because the saturation is not reflected in the ADC power (e.g., because the strong out-of-band signal is filtered out before being provided to the ADC). This can result in gain compression, small in-band power, etc., which can lead to incorrect calibration of the noise floor. Moreover, a strong in-band interfering signal may also cause the ADC output to become saturated. The AGC may require multiple trials and errors to determine a desirable gain setting. This may be because the AGC may only be aware of the saturated ADC output and may be unaware of the actual ADC power or by how much to reduce RF gain in order to eliminate saturation and receive the RF signal. Additionally, it may not be possible to receive the RF signal if the out-of-band interfering signal is much stronger that the in-band signal.

Functionality can be implemented in the RF front end to help avoid gain compression and saturation in the RF front end. In some embodiments, the RF front end in the receive chain is modified to include a peak detector and an RF saturation detection unit that can help determine the strength of the RF signal. The amplitude of the RF signal can be compared with a set of thresholds to determine whether and how often the RF front end is saturated. The AGC unit can receive a notification of the RF saturation and accordingly set the RF gain at an appropriate value in order to facilitate RF signal reception without distortion. This can help minimize RF saturation, gain compression, false detection and other performance degradation.

FIG. 1 is an example block diagram illustrating a WLAN receive chain 100 comprising a mechanism for detecting RF saturation and accordingly reducing RF gain. In some embodiments, the WLAN receive chain 100 comprises a peak detector 101, an automatic gain control (AGC) unit 120, an analog to digital converter (ADC) 112, and a signal processing unit 114. The AGC unit 120 comprises an RF saturation detection unit 102, an ADC processing unit 106, a gain change unit 108, and an in-band power calculation unit 110. In FIG. 1, a received RF signal is provided to the peak detector 101 and to the ADC 112. The output of the peak detector 101 is provided to the RF saturation detection unit 102. The output of the RF saturation detection unit 102 is provided to the gain change unit 108. The output of the ADC 112 is provided to the signal processing unit 114 and to the ADC processing unit 106. The output of the signal processing unit 114 is provided to the in-band power calculation unit 110 and to subsequent processing units. The output of the in-band power calculation unit 110 and the output of the ADC processing unit 106 are provided to the gain change unit 108.

Figure 2:
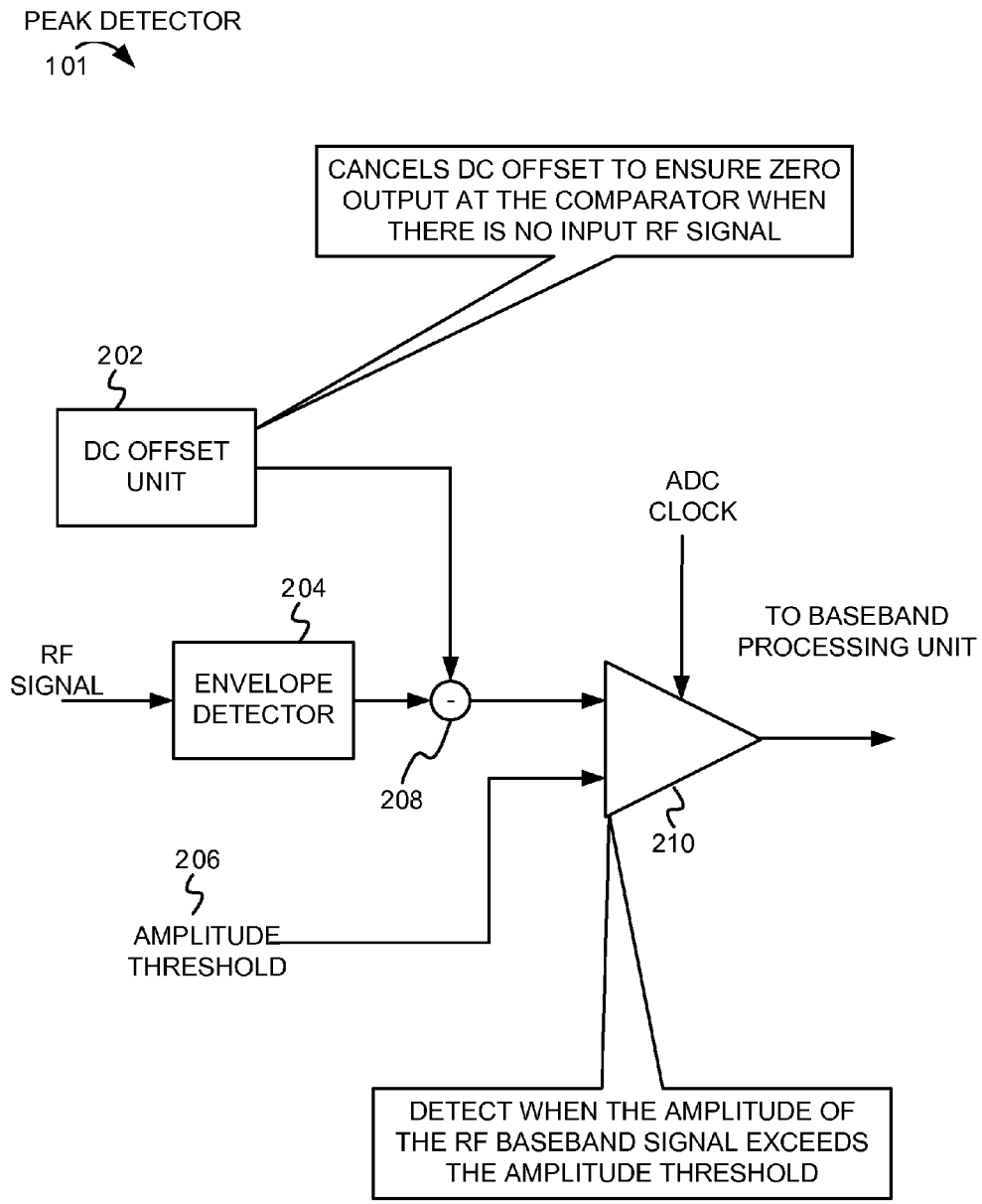
FIG. 2 is an example block diagram illustrating a peak detector.

The peak detector 101 is configured to detect saturation in an RF front end. The peak detector 101 determines and indicates a number of times (within a time interval) the amplitude of a signal exceeds an amplitude threshold. FIG. 2 illustrates an example block diagram of the peak detector 101. The peak detector 101 comprises a DC offset unit 202, an envelope detector 204, an amplitude threshold 206, and a comparator 210. The envelope detector 204 receives an RF signal. The envelope detector 204 follows the narrowband envelope of the received RF signal and generates an amplitude of the received RF signal at the output of the envelope detector 204. A subtractor 208 subtracts a DC offset, generated by the DC offset unit 202, from the amplitude of the received RF signal at the output of the envelope detector 204. In one implementation, the DC offset unit 202 may be a 6-bit DAC. In other implementations, the DC offset unit 202 can be other suitable components that generate the requisite DC offset.

The DC offset unit 202 may generate the DC offset to cancel the DC offset of the envelope detector 204. In other words, the DC offset is adjusted so as to compensate for a mismatch between various components of the peak detector 101 that might cause the comparator 210 to generate a high amplitude output signal even when the input signal (i.e., the received RF signal) is zero. In one embodiment, to determine the DC offset, the input to the envelope detector 204 is set to zero. If the output of the comparator 210 in the absence of the received RF signal is a high amplitude output signal, a binary search is performed to calibrate the DC offset unit 202. The binary search is performed by adjusting the output of the DC offset unit 202 to a higher or a lower setting based on the sign of the output of the comparator 210. In one example, a highest DC offset that produces a low amplitude output signal (e.g., a zero output) at the output of the comparator 210 is selected as the DC offset.

After the subtractor 208 compensates for the DC offset, the output of the subtractor 208 is provided to one of the input terminals of the comparator 210. The amplitude threshold 206 is fed as a second input to the comparator 210. The comparator 210 may compare the amplitude of the received RF signal to the amplitude threshold 206 to detect when the amplitude of the received RF signal exceeds the amplitude threshold 206. In one implementation, the amplitude threshold 206 may be provided by a 4-bit digital to analog converter (DAC). In one implementation, the amplitude threshold 206 can be set so that the amplitude of the received RF signal is no more than −4 dBm (e.g., 140 mv @ 50 ohm). In another implementation, the amplitude threshold 206 may be set to other suitable values, and may be determined based, at least in part, on linearity requirements of LNA/mixer in the RF chain and sensitivity requirements of the peak detector 101. The output of the comparator 210 is sampled to generate a sampled output at a pre-determined frequency. In one implementation, the output of the comparator 210 may be sampled at an ADC clock frequency. In another implementation, the output of the comparator 210 may be sampled at other suitable frequencies.

Figure 4:
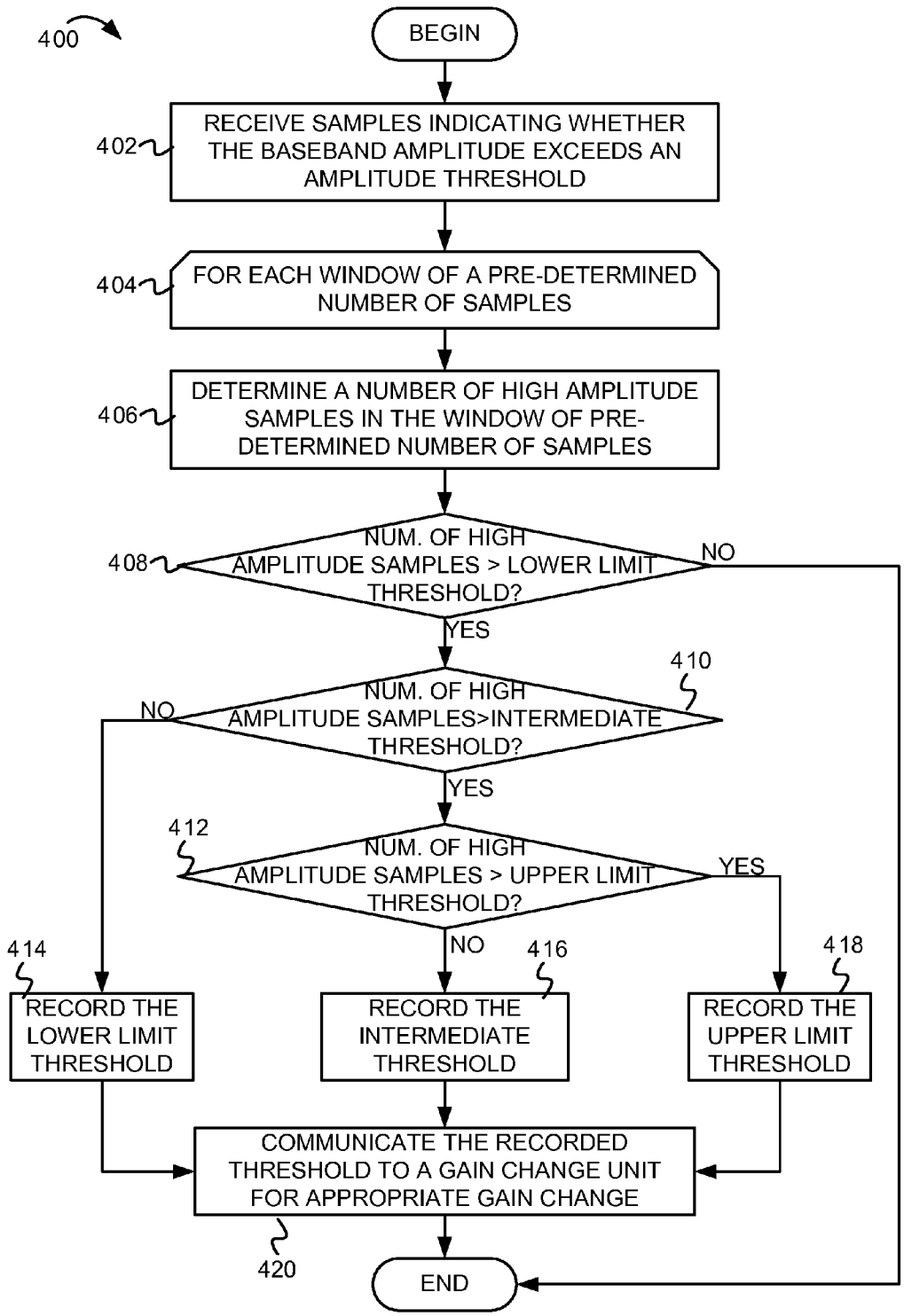
FIG. 4 is a flow diagram illustrating example operations for detecting RF saturation.

Referring back to FIG. 1, the RF saturation detection unit 102 receives the sampled output signal of the peak detector 101. In one embodiment, the RF saturation detection unit 120 receives a plurality of samples that indicate whether or not the amplitude of the received RF signal exceeds the amplitude threshold of the peak detector 101. A high amplitude sample indicates that the amplitude of the received RF signal exceeds the amplitude threshold, while a low amplitude sample indicates that the amplitude of the received RF signal does not exceed the amplitude threshold. The RF saturation detection unit 102 generates an output signal that indicates RF saturation based on the detected samples from the peak detector 101. In one implementation, the RF saturation detection unit 102 counts a number of high amplitude samples in a pre-determined window, compares the number of high amplitude samples against a set of thresholds, and generates the output signals to indicate how often RF saturation occurs. FIG. 4 further describes operations of the RF saturation detection unit 102 for detecting RF saturation.

The gain change unit 108 is configured to perform coarse and fine gain tuning Based on the output signals received from the RF saturation detection unit 102, the gain change unit 108 can drop RF gain by a coarse gain drop value, as will be further described below with reference to FIGS. 5-8. The ADC 112 converts an analog baseband signal to yield a digital baseband signal. The signal processing unit 114 filters the digital RF baseband signal, performs IQ calibration, etc. The in-band power calculation unit 110 can calculate the in-band power of the baseband signal based on input from the signal processing unit 114. Additionally, the ADC processing unit 106 determines an ADC power of the digital baseband signal. Based on the in-band power received from the in-band power calculation unit 110 and the ADC power received from the ADC processing unit 106, the gain change unit 108 can perform fine gain tuning, as will be further described below with reference to FIG. 9.

Figure 3:
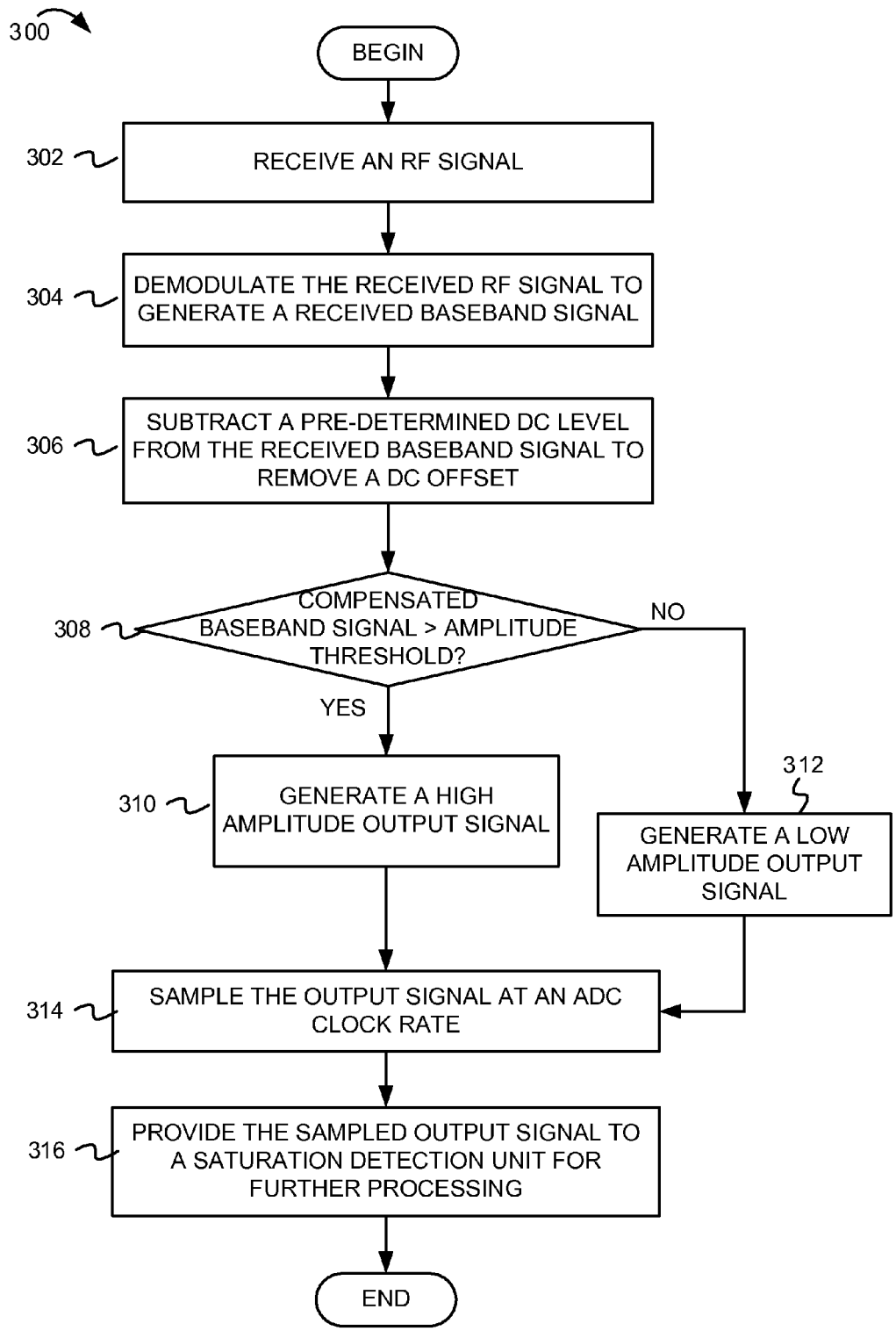
FIG. 3 is a flow diagram illustrating example operations of a peak detector.

FIG. 3 is a flow diagram illustrating example operations of a peak detector. Flow 300 begins at block 302.

At block 302, an RF signal is received. For example, the peak detector 101 in the WLAN receive chain 100 of FIG. 1 may receive the RF signal. In one embodiment, the RF envelope detector 204 of the peak detector 101 (shown in FIG. 2) may receive the RF signal. The flow continues at block 304.

At block 304, the received RF signal is demodulated to generate a baseband signal ("received baseband signal"). For example, the RF envelope detector 204 may generate an envelope waveform (i.e., the received baseband signal) as an output in response to receiving the RF signal. The flow continues at block 306.

At block 306, a pre-determined DC level is subtracted from the received baseband signal to remove a DC offset. For example, the subtractor 208 may subtract the pre-determined DC level from the received baseband signal. In some implementations, mismatches between various components in the peak detector 101 may result in a non-zero output at the peak detector 101 even when the input (i.e., the received RF signal) to the peak detector 101 is zero. This could potentially lead to false detection. Subtracting the pre-determined DC level from the received baseband signal can help remove DC offsets that could result in false detection. In some implementations, the pre-determined DC level may be set to cancel the DC offsets that are greater than 100 mV. The pre-determined DC level may be calculated based on a binary search algorithm as described with reference to FIG. 2. The flow continues at block 308.

At block 308, it is determined whether amplitude of the compensated baseband signal is greater than an amplitude threshold. For example, the comparator 210 may compare the amplitude of the compensated baseband signal against the amplitude threshold. In one implementation, the comparator 210 may compare the amplitude of the compensated baseband signal with the amplitude threshold every ADC clock cycle. In another implementation, the comparator 210 may continuously compare the amplitude of the compensated baseband signal with the amplitude threshold. The amplitude threshold may be determined based on gain of various processing units in the WLAN receive chain (e.g., LNA gain, mixer gain, analog gain, etc). For example, if the gain of the various processing units is at (or close to) a maximum gain setting, the amplitude threshold may be low because a slight increase in amplitude of the baseband signal may result in RF saturation and gain compression. Alternately, if the gain of the various processing units is low, the amplitude threshold may be high because the receive chain may be able to handle a higher amplitude of the baseband signal without resulting in RF saturation and gain compression. In some implementations, the amplitude threshold may be dynamically changed depending on operating conditions of the WLAN receive chain (e.g., gain of the processing units, saturation point, etc.). If it is determined that the amplitude of the compensated baseband signal is greater than the amplitude threshold, the flow continues at block 310. Otherwise, the flow continues at block 312.

At block 310, a high amplitude output signal is generated. For example, the comparator 210 generates the high amplitude output signal (e.g., a digital 1) in response to determining that the amplitude of the compensated baseband signal is greater than the amplitude threshold. The flow continues at block 314.

At block 312, a low amplitude output signal is generated. For example, the comparator 210 generates the low amplitude output signal (e.g., a digital 0) in response to determining that the amplitude of the compensated baseband signal is less than the amplitude threshold. The flow continues at block 314.

At block 314, the output signal is sampled at the ADC clock rate. For example, a sampling unit coupled to the output of the peak detector 101 may sample the output signal generated by the comparator 210. In one implementation, the sampling unit can generate one sample of the output signal for each ADC clock cycle. In another implementation, the sampling unit can generate other suitable number of samples of the output signal for each ADC clock cycle. The sampling rate and the number of samples generated per ADC clock cycle may be determined based on performance requirements and quantization cost. The ADC clock rate may be 88 MHz, 80 MHz, 44 MHz, or other suitable clock frequencies, e.g., clock frequencies that are greater than or equal to twice the highest frequency of the received RF signal. The sampled output signal provides an indication of the presence and the severity of RF saturation. The flow continues at block 316.

At block 316, the sampled output signal is provided to a saturation detection unit for further processing. For example, the peak detector 101 provides the sampled output to the RF saturation detection unit 102 in the AGC unit 120 of FIG. 1. The number of high amplitude samples (sampled output=1) in a pre-defined window is compared against one or more gain thresholds to determine whether and by how much RF gain should be decreased, as will be further described with reference to FIGS. 4-8. From block 316, the flow ends.

FIG. 4 is a flow diagram illustrating example operations for detecting RF saturation. Flow 400 begins at block 402.

At block 402, samples indicating whether amplitude of a baseband signal exceeds an amplitude threshold are received. For example, the RF saturation detection unit 102 in the AGC unit 120 of FIG. 1 may receive the samples indicating whether the amplitude of a baseband signal exceeds the amplitude threshold from the peak detector 101. The flow continues at block 404.

At block 404, a loop begins for each window of a pre-determined number of samples. The number of samples that constitute a window ("length of the window") may be programmable. In one example, the length of the window may be based, at least in part, on an ADC clock frequency. In one implementation, the length of the window may comprise samples accumulated over 16 ADC clock cycles (e.g., 16 samples). In another implementation, the length of the window may comprise samples accumulated over 32 ADC clock cycles. By analyzing each window of the pre-determined number of samples, the presence and the severity of RF saturation can be determined. The flow continues at block 406.

At block 406, a number of high amplitude samples in the window of the pre-determined number of samples are determined. For example, the RF saturation detection unit 102 counts the number of high amplitude samples in the window of the pre-determined number of samples. As described above, a high amplitude sample can indicate a presence of RF saturation, while a low amplitude sample can indicate an absence of RF saturation. The number of high amplitude samples in the window of the pre-determined number of samples can indicate the degree of saturation and a presence of a strong in-band or out-of-band interfering signal. Consequently, this can help determine a reliable estimate of the severity of the RF saturation. Based on knowledge of the strength of the baseband signal and the severity of the RF saturation in the baseband signal, the RF gain can be appropriately decreased. The flow continues at block 408.

At block 408, it is determined whether the number of high amplitude samples is greater than a lower limit gain threshold. In one implementation, the RF saturation detection unit 102 compares the number of high amplitude samples against the lower limit gain threshold. As an example, the window may comprise 16 samples and the lower limit gain threshold may be set at 3 samples. If the number of the high amplitude samples in the window of 16 samples is less than or equal to 3, it may be determined that the RF gain should not be varied. The number of high amplitude samples being less than the lower limit gain threshold may indicate that RF saturation is infrequent and therefore it may not be necessary to decrease the RF gain. If the number of high amplitude samples in the window of 16 samples is greater than 3, the number of high amplitude samples may be compared against another higher gain threshold. If the RF saturation detection unit 102 determines that the number of high amplitude samples is greater than the lower limit gain threshold, the flow continues at block 410. Otherwise, the flow ends.

At block 410, it is determined whether the number of high amplitude samples is greater than an intermediate gain threshold. For example, the RF saturation detection unit 102 compares the number of high amplitude samples against the intermediate gain threshold. If it is determined that the number of high amplitude samples is greater than the intermediate gain threshold, the flow continue at block 412. Otherwise, the flow continues at block 414.

At block 412, it is determined whether the number of high amplitude samples is greater than an upper limit gain threshold. For example, the RF saturation detection unit 102 compares the number of high amplitude samples against the upper limit gain threshold. Comparing the number of high amplitude samples against the gain thresholds allows the RF saturation detection unit 102 to determine how often RF saturation happens in the RF front end. For example, RF saturation rarely occurs if the number of high amplitude samples is less than the lower limit gain threshold. As another example, RF saturation occurs with a high frequency if the number of high amplitude samples exceeds the upper limit gain threshold. If it is determined that the number of high amplitude samples is greater than the upper limit gain threshold, the flow continue at block 418. Otherwise, the flow continues at block 416.

At block 414, the lower limit gain threshold is recorded. The flow 400 moves from block 410 to block 414 if the RF saturation detection unit 102 determines that the number of high amplitude samples does not exceed the intermediate gain threshold. In other words, the RF saturation detection unit 102 records the lower limit gain threshold if the number of high amplitude samples lies between the lower limit gain threshold and the intermediate gain threshold. The flow continues at block 420.

At block 416, the intermediate gain threshold is recorded. The flow 400 moves from block 412 to block 416 if the RF saturation detection unit 102 determines that the number of high amplitude samples does not exceed the upper limit gain threshold. In other words, the RF saturation detection unit 102 records the intermediate gain threshold if the number of high amplitude samples lies between the intermediate gain threshold and the upper limit gain threshold. The flow continues at block 420.

At block 418, the upper limit gain threshold is recorded. The flow 400 moves from block 412 to block 418 if the RF saturation detection unit 102 determines that the number of high amplitude samples exceeds the upper limit gain threshold. The flow continues at block 420.

At block 420, the recorded gain threshold is communicated to a gain change unit to for an appropriate gain change. For example, the RF saturation detection unit 102 may communicate the recorded gain threshold to the gain change unit 108. The gain change unit 108 may, in turn, determine an amount by which the RF gain should be decreased, as will be described with reference to FIG. 5. From block 420, the flow ends.

It should be noted that although FIG. 4 describes the RF saturation detection unit 102 as comparing the number of high amplitude samples with three gain thresholds (i.e., the lower limit, the intermediate, and the upper limit gain thresholds), in some implementations, the RF saturation detection unit 102 can compare the number of high amplitude samples against other suitable number of thresholds (e.g., four threshold, six threshold, etc.). In one example, the number of gain threshold and the values of the gain thresholds may be dependent on a receive chain mixer and on LNA gain because the mixer is typically the bottleneck of a compression point in the WLAN receive chain. In other words, when the mixer gain is low, a large amplitude RF signal may be tolerated at the mixer input (without resulting RF saturation). However, the mixer input should typically be lower when the mixer gain is high.

Figure 5:
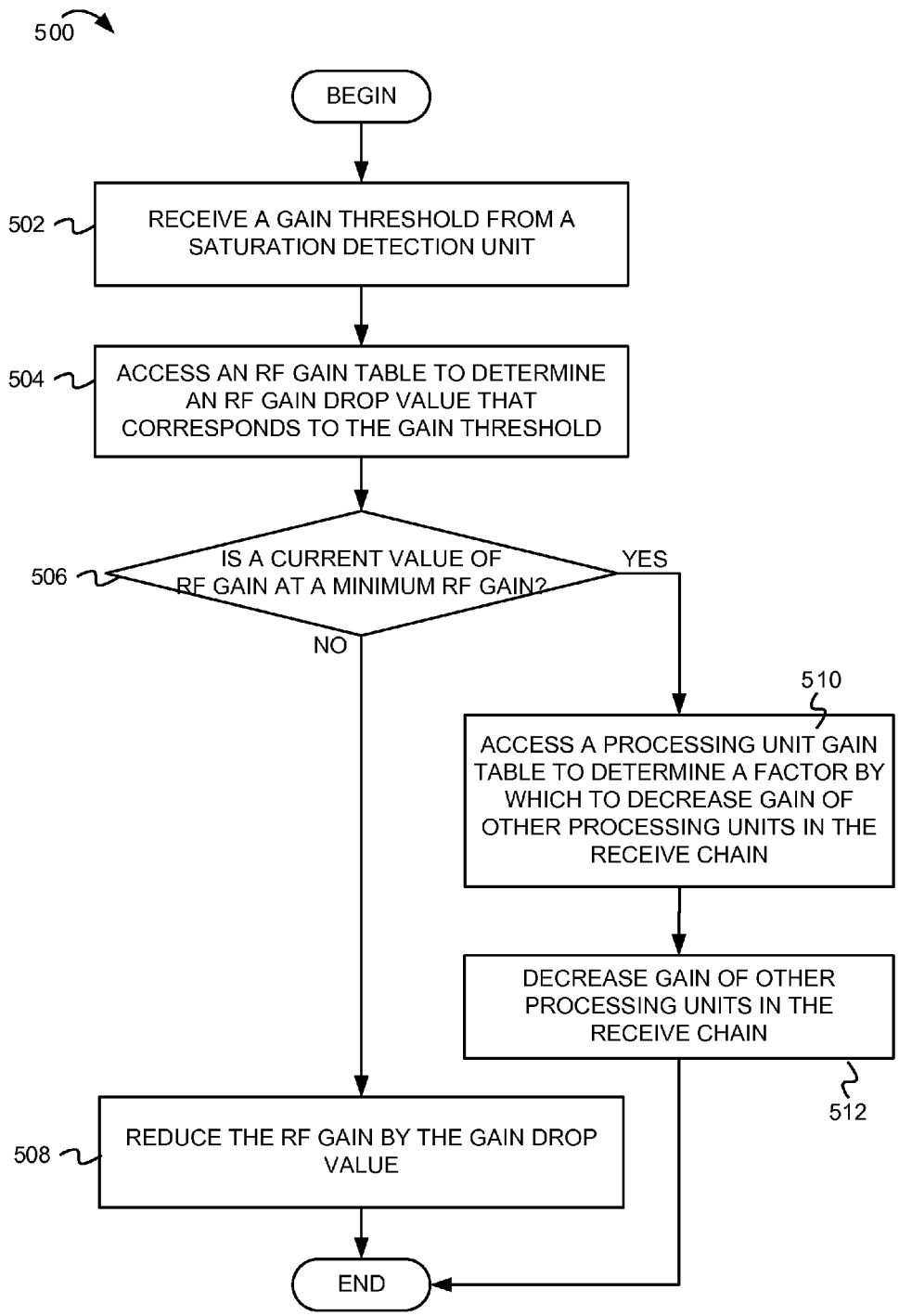
FIG. 5 is a flow diagram illustrating example operations for decreasing RF gain based on data indicating the occurrence and severity of RF saturation.

FIG. 5 is a flow diagram illustrating example operations for decreasing RF gain based on data indicating the occurrence and severity of RF saturation. Flow 500 begins at block 502.

At block 502, a gain threshold is received from a saturation detection unit. For example, a gain change unit 108 in an AGC unit 120 of FIG. 1 receives the gain threshold from an RF saturation detection unit 102. As described with reference to flow 400, the RF saturation unit 102 compares samples of a peak detector's output against multiple gain thresholds and determines the gain threshold that the number of high amplitude samples exceeds. The flow continues at block 504.

At block 504, an RF gain table is accessed to determine an RF gain drop value that corresponds to the gain threshold. For example, the gain change unit 108 may access the RF gain table to determine the appropriate RF gain drop value. In one implementation, the RF gain table may comprise two sets of RF gain drop values—a first set of RF gain drop values for RF signals in a 2.4 GHz frequency band and a second set of RF gain drop values for RF signals in a 5 GHz frequency band. In one implementation, the RF gain table may comprise RF gain drop values that correspond to each of the gain thresholds. For example, on receiving a lower limit gain threshold, the gain change unit 108 may determine that the RF gain should be decreased by a low RF gain drop value. As another example, on receiving the intermediate gain threshold, the gain change unit 108 may determine that the RF gain should be decreased by an intermediate RF gain drop value. As yet another example, on receiving the upper limit gain threshold, the gain change unit 108 may determine that the RF gain should be decreased by a high RF gain drop value. This can ensure that the drop in RF gain is proportional to how frequently RF saturation occurs in an RF front end of a WLAN receive chain. The flow continues at block 506.

At block 506, it is determined whether a current value of the RF gain is at a minimum RF gain. For example, the gain change unit 108 may determine the current value of the RF gain and compare it to the minimum RF gain. If it is determined that the current value of the RF gain is equal to the minimum RF gain, the flow continues at block 510. Otherwise, the flow continues at block 508.

At block 508, the RF gain is reduced by the determined RF gain drop value. For example, the gain change unit 108 may decrease the RF gain of the RF front end in the WLAN receive chain based, at least in part, on the RF gain threshold as indicated by the RF saturation detection unit 102 and based on accessing the RF gain table. From block 506, the flow ends.

At block 510, a processing unit gain table is accessed to determine a value by which to decrease gain of other processing units in the receive chain ("processing unit gain drop value"). The flow 500 moves from block 506 to block 510 on determining that the current value of the RF gain is at the minimum RF gain. Because the current RF gain is at the minimum value, the current RF gain cannot be decreased further. Therefore, the gain of the other processing units is decreased to avoid gain compression. The processing unit gain table comprises a gain table that affects gain of mixer(s), a biquad filter, RC filter(s), FIR filter(s), and other baseband component(s) in the WLAN receive chain. The processing unit gain drop value may be determined based on the processing unit gain table and the gain threshold received from the RF saturation detection unit 102. The flow continues at block 512.

At block 512, the gain of the other processing units in the receive chain is varied. For example, the gain change unit 108 varies the gain of mixer(s), filter(s), and/or other baseband components in the WLAN receive chain by the processing unit gain drop value. From block 512, the flow ends.

Figure 6:
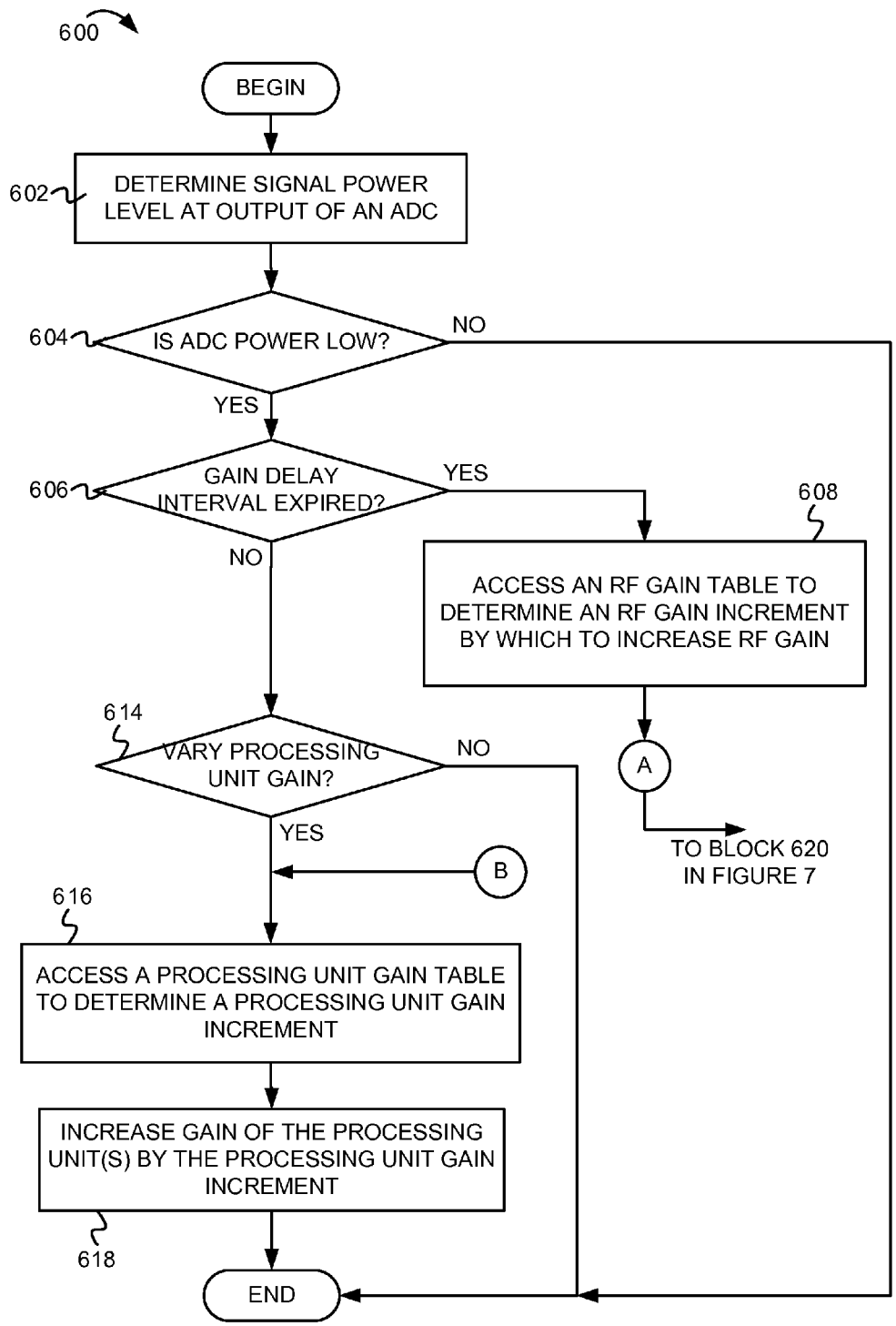
FIG. 6 is a flow diagram illustrating example operations for minimizing RF gain oscillations.
Figure 7:
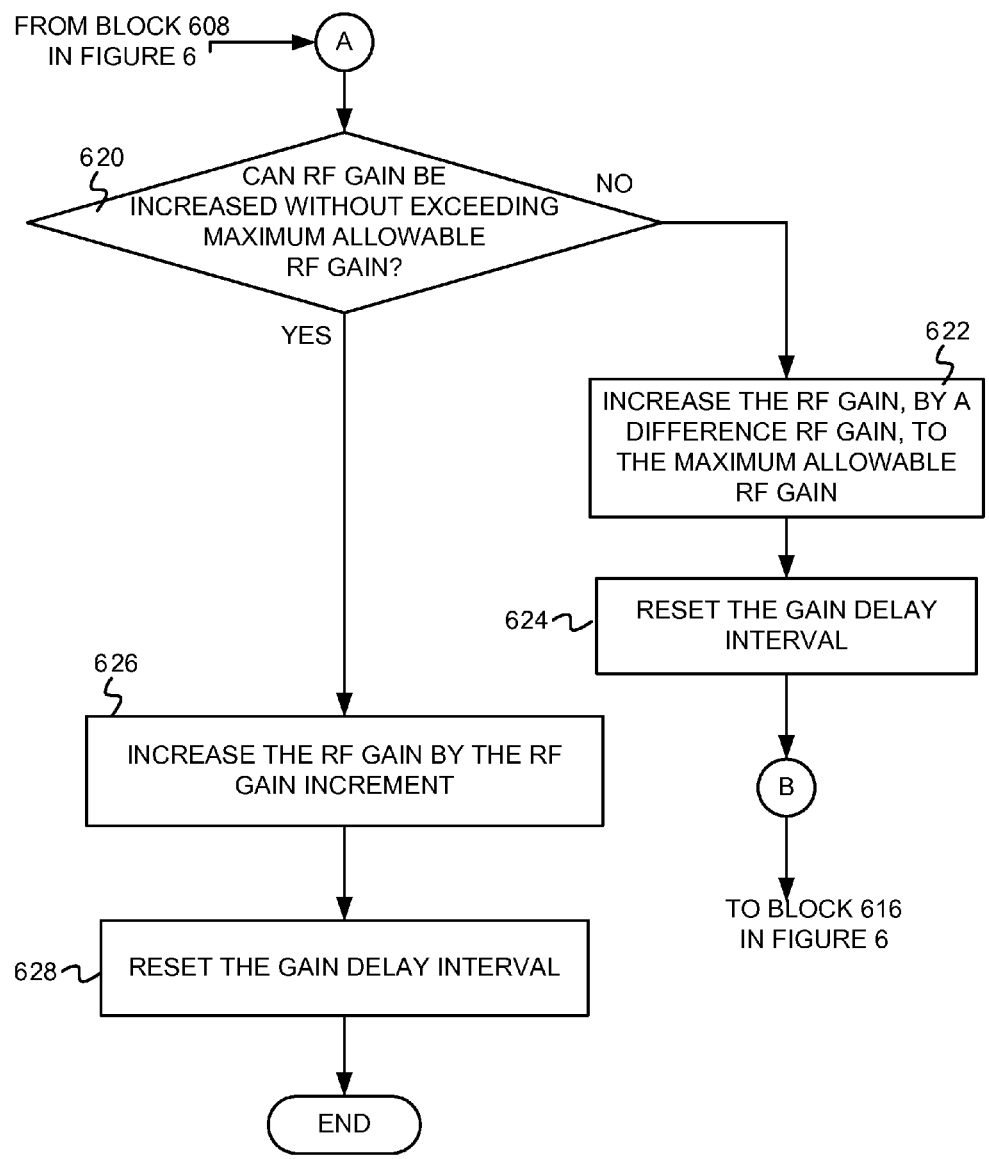
FIG. 7 is a flow diagram illustrating example operations for minimizing RF gain oscillations.

FIG. 6 and FIG. 7 illustrate a flow diagram illustrating example operations for minimizing RF gain oscillations. Flow 600 begins at block 602 in FIG. 6.

At block 602, a signal power level at an output of an ADC ("ADC power") is determined. For example, the ADC processing unit 106 in an AGC unit 120 of FIG. 1 may determine the ADC power. The ADC power may be determined based on samples of a baseband signal at the output of the ADC 112. The ADC power is representative of the received signal strength indicator (RSSI) of a received RF signal that comprises the baseband signal. The flow continues at block 604.

Figure 8A:
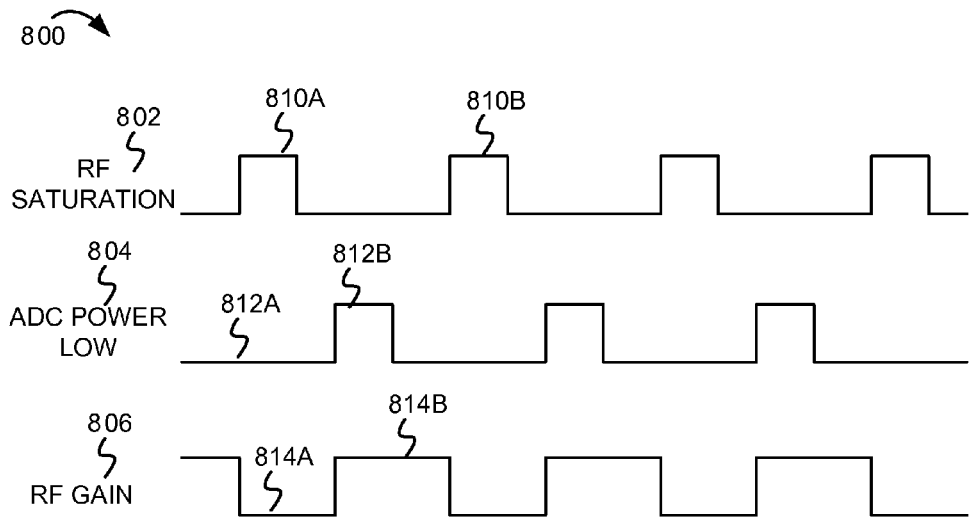
FIG. 8A is an example timing diagram illustrating RF gain oscillations.

At block 604, it is determined whether the ADC power is low. For example, the gain change unit 108 may compare the ADC power against a threshold power to determine whether the ADC power is low. If ADC power is low (e.g., the ADC power is less than the threshold power), there is a possibility that the AGC may oscillate between a gain setting that results in RF saturation and a gain setting that results in low ADC power if there is a strong continuous out-of-band interfering signal as illustrated in FIG. 8A. FIG. 8A is an example timing diagram 800 illustrating RF gain oscillations. FIG. 8A depicts a graph of RF saturation 802, ADC power low signal 804, and RF gain 806. As depicted in FIG. 8A, RF saturation is detected at 810A and the RF gain 806 is decreased at 814A. Because of the decrease in RF gain at 814A, at the output of the ADC, a low output ADC signal 812A is detected. This, in turn, results in the RF gain being increased at 814B to compensate for the low ADC power 812A, which consequently results in RF saturation at 810B. Such an oscillation of the RF gain 806 and an oscillation in the RF saturation 802 is not desirable as it may interfere with a WLAN receive chain's ability to receive the RF signal and correctly retrieve data carried by the RF signal. Referring back to FIG. 6, if it is determined that the ADC power is low, the flow continues at block 606. Otherwise, the flow ends.

Figure 8B:
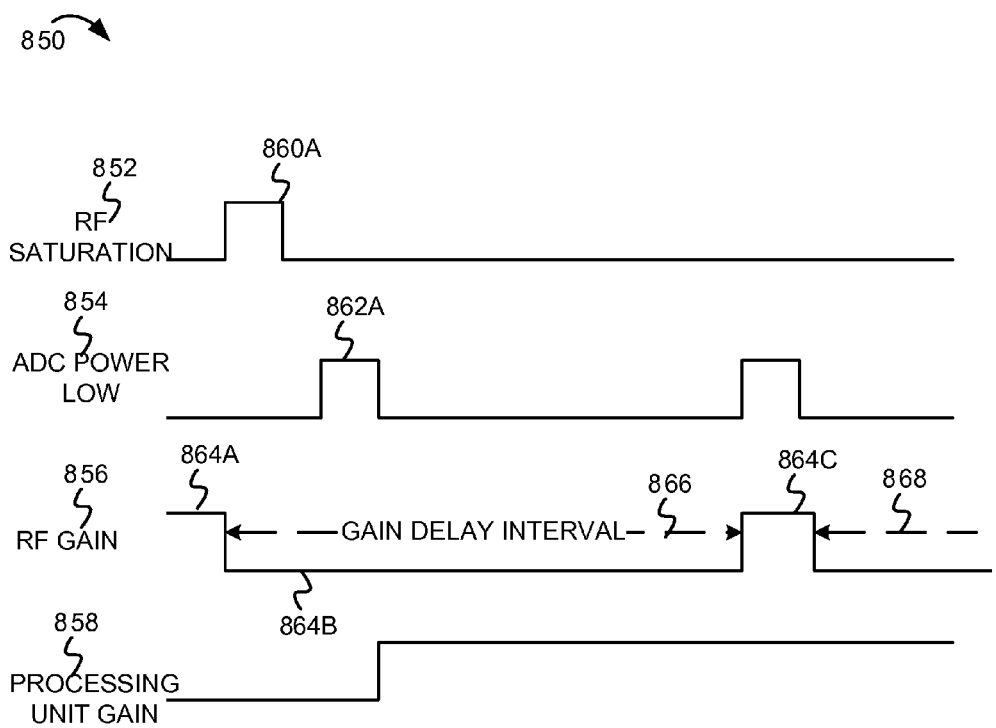
FIG. 8B is an example timing diagram illustrating techniques for minimizing RF gain oscillations.

At block 606, it is determined whether a gain delay interval is expired. For example, the gain change unit 108 may determine whether the gain delay interval is expired. The gain delay interval sets a minimum time interval for which the RF gain should not be changed after detecting RF saturation and accordingly decreasing the RF gain. This is further illustrated in FIG. 8B. FIG. 8B is an example timing diagram 850 illustrating techniques for minimizing RF gain oscillations. FIG. 8B depicts a graph of RF saturation 852, an ADC power low signal 854, RF gain 856, and processing unit gain 858. A programmable timer may be used to set the gain delay interval 866. The gain delay interval 866 serves as an indication for determining whether or not RF saturation has occurred recently. As depicted in FIG. 8B, RF saturation occurs at 860A and the RF gain is consequently dropped from 864A to 864B. The gain delay interval 866 begins as soon as the RF gain is dropped (864B) in response to detecting the RF saturation at 860A. As depicted in FIG. 8B, RF gain change is disabled while the gain delay interval 866 is valid. Referring back to FIG. 6, if it is determined that the gain delay interval has expired, the flow continues at block 608. Otherwise, the flow continues at block 614.

At block 614, it is determined whether gain of one or more processing units in the receive chain should be varied. For example, the gain change unit 108 may determine whether the gain of the one or more processing units should be varied. The other processing units can include filters (e.g., biquad filters, FIR filters, etc.), mixers, and other baseband processing units. The flow 600 moves from block 606 to block 614 if the gain change unit 108 determines that the gain delay interval has not expired. In some implementations, a current gain setting of the one or more processing units may be compared against threshold gain settings. If it is determined that the current gain setting of the one or more processing units is at a maximum allowable gain setting, the processing unit gain may not be varied irrespective of the ADC power level and/or a current RF gain. If it is determined that the gain of one or more processing units in the receive chain should be varied, the flow continues at block 616. Otherwise, the flow ends.

At block 616, a processing unit gain table is accessed to determine a processing unit gain increment by which to increase the gain of the one or more processing units in the receive chain. For example, the gain change unit 108 may access the processing unit gain table to determine the processing unit gain increment. With reference to FIG. 8B, during the gain delay interval 866, RF gain change may be prevented, but the gain of the processing units 858 may be varied. The processing unit gain 858 is increased in response to a low ADC power 862A and a low RF gain 864B. Referring back to FIG. 6, the flow continues at block 618.

At block 618, the gain of the one or more processing units is increased by the processing unit gain increment. For example, the gain change unit 108 may increase the gain of mixer(s), filter(s) and/or other baseband components in the receive chain. In one implementation, the gain change unit 108 may vary (based on the processing unit gain table) coefficients of the one or more processing units of the receive chain to increase the gain of one or more processing units. The gain of the one or more processing units may be increased, in accordance with a processing unit gain table, until the gain of the one or more processing units reaches a maximum allowable value. From block 618, the flow ends.

At block 608, an RF gain table is accessed to determine an RF gain increment. The flow 600 moves from block 606 to block 608 on determining that the gain delay interval has expired. In one implementation, the gain change unit 108 may access the RF gain table to determine the RF gain increment. With reference to FIG. 8B, once the gain delay interval 866 expires, RF gain change may be permitted. The gain change unit 108 may determine the RF gain increment based, in part, on the RF gain table and the ADC power. In some implementations, the gain change unit 108 may take an in-band power of the RF signal into consideration while determining the RF gain increment. After block 608, the flow continues at block 620 in FIG. 7.

At block 620, it is determined whether the RF gain can be increased without exceeding a maximum allowable RF gain. For example, the gain change unit 108 may determine whether the RF gain can be increased without exceeding the maximum allowable RF gain. The RF gain table may indicate the maximum allowable RF gain and/or a maximum value by which the RF gain can be increased. The gain change unit 108 may subtract a current value of the RF gain from the maximum allowable RF gain and compare the difference with the RF gain increment to determine whether the current value of the RF gain can be increased. If it is determined that the RF gain can be increased without exceeding the maximum allowable RF gain, the flow continues at block 626. Otherwise, the flow continues at block 622.

At block 626, the RF gain is increased by the RF gain increment. For example, the gain change unit 108 may increase the RF gain of the RF front end by the RF gain increment. As depicted in FIG. 8B, the RF gain is increased from 864B to 864C after the gain delay interval 866 expires. The RF gain 864C may be determined based on accessing the RF gain table and based on the ADC power. After block 626, the flow continues at block 628 of FIG. 7.

At block 628, the gain delay interval is reset. For example, the gain change unit 108 may reset the gain delay interval so as to prevent variations of the RF gain once the RF gain is increased at block 626. In one implementation, the gain delay interval may be 256 milliseconds. In another implementation, the gain delay interval may be determined based on the AGC clock rate. As depicted in FIG. 8B, the gain delay interval 868 is reset. Also, although the RF gain 856 still oscillates between a large RF gain 864A and small RF gain 864B, the frequency of oscillation is much lower than the frequency of oscillation when the gain delay interval 866 is not used (as depicted in FIG. 8A). After block 628 of FIG. 7, the flow ends.

At block 622, the RF gain is increased by a difference RF gain so that the RF gain equals to the maximum allowable RF gain. The flow 600 moves from block 620 to block 622 on determining that the RF gain cannot be increased without exceeding the maximum allowable RF gain. For example, the gain change unit 108 may increase the RF gain by the difference RF gain. The difference RF gain may be determined by subtracting the current RF gain from the maximum allowable RF gain. In one example, the gain of the one or more processing units (e.g., mixer, filters, etc.) may then be increased to compensate for the remainder of the RF gain increment. The flow continues at block 624.

At block 624, the gain delay interval is reset. The gain change unit 108 may reset the gain delay interval similarly as described with reference to block 628. The gain change unit 108 can also compensate for the remainder of the RF gain increment by increasing the gain of one or more processing units in the receive chain. From block 624, the flow continues at block 616 in FIG. 6, where the gain change unit 108 determines a processing unit gain increment by which to increase the gain of processing unit(s) in the receive chain taking into consideration a partial increase in RF gain (e.g., by the difference RF gain). The flow ends after the gain of the processing unit(s) is increased to compensate for the low ADC power.

In some embodiments, coarse gain changes as described with reference to FIGS. 3-8 can be performed as the WLAN receive chain 100 of FIG. 1 receives a preamble of the RF signal. The gain control unit 108 locks down on an appropriate RF gain before the WLAN receive chain 100 begins packet reception. This is because once packet reception begins the RF gain cannot be changed. The gain change unit 108 can perform fine gain tuning, as described with reference to FIG. 9, towards the end of the preamble. The fine gain tuning helps ensure that the RF gain is at an appropriate gain level to minimize or prevent RF saturation or gain compression.

Figure 9:
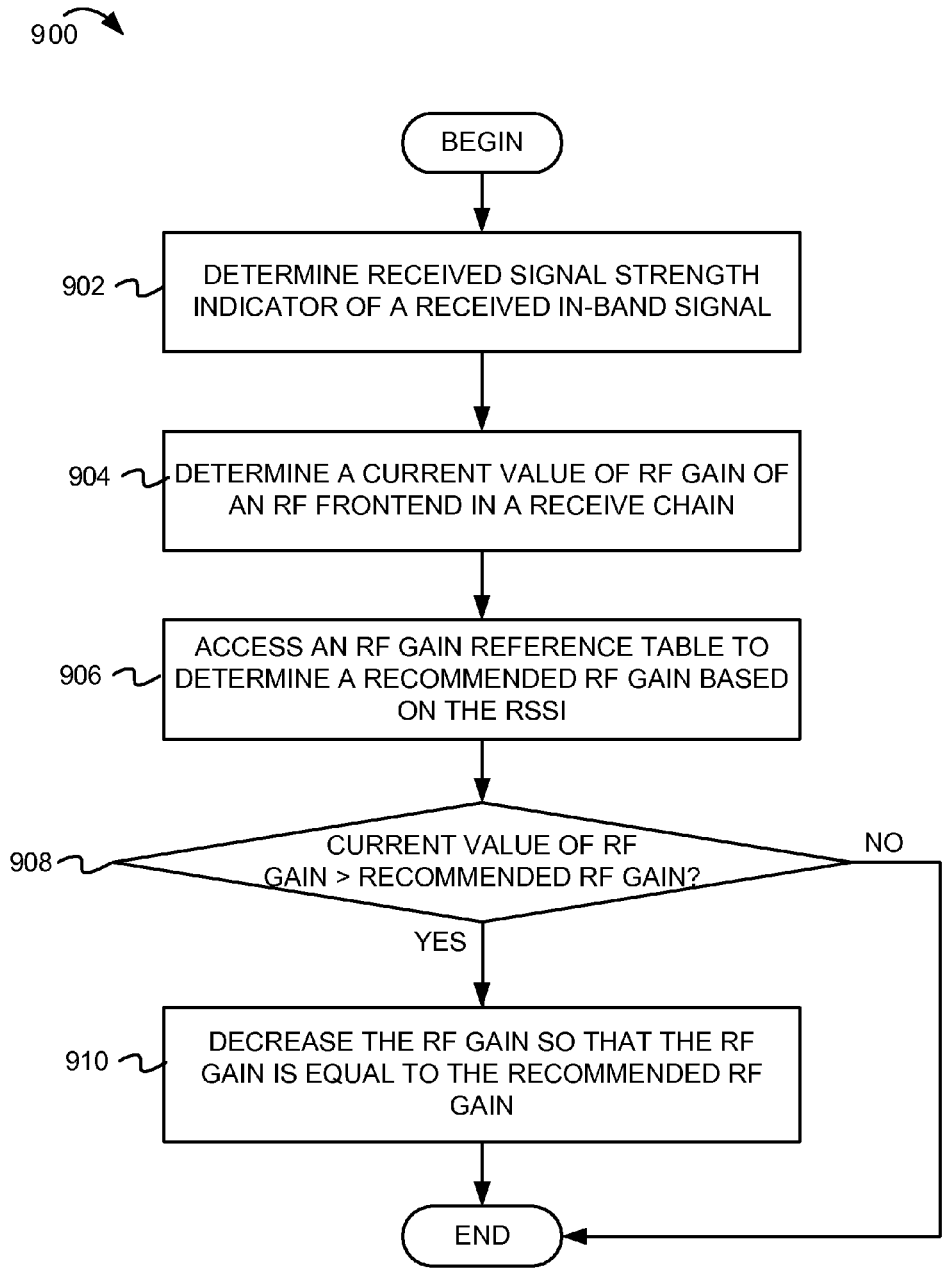
FIG. 9 is a flow diagram illustrating example operations for fine gain control.

FIG. 9 is a flow diagram illustrating example operations for fine gain control. Flow 900 begins at block 902.

At block 902, a received signal strength indicator (RSSI) of a received in-band signal is determined. For example, the ADC processing unit 106 in the AGC unit 120 of FIG. 1 may calculate the RSSI of the in-band signal. The flow continues at block 904.

At block 904, a current value of RF gain of an RF front end in a receive chain is determined. For example, the gain change unit 108 may determine the current value of the RF gain. In one implementation, the gain change unit 108 may access an RF gain table to determine the current value of the RF gain. The flow continues at block 906.

At block 906, an RF gain reference table is accessed to determine a recommended RF gain based on the RSSI. For example, the gain change unit 108 may access the RF gain reference table to determine the recommended RF gain. The reference gain table provides a mechanism for fine turning of the RF gain, after coarse tuning the RF gain based on the output from the peak detector (as described with reference to FIGS. 4 and 5). In one example, the peak detector 101 of FIG. 1 may not be sensitive enough to detect all the out-of-band signals that are large enough to cause gain compression. In other words, some out-of-band signals may avoid being detected by the peak detector 101 but may still be strong enough to cause gain compression. Based on knowledge of the RSSI, components of the receive chain 100 should be designed to handle a certain blocker signal level (e.g., as defined by IEEE specifications). Based on knowledge of the RSSI, the blocker signal level, in-band power, and linearity requirements of the RF front end, the recommended RF gain can be determined. The RF gain reference table indicates a relationship between RSSI and the recommended RF gain. For example, it may be determined that the in-band power is 30 dB higher than the noise floor and that the out-of-band blocker level is 50 dB higher than the noise floor. Based on accessing the RF gain reference table, it may be determined that because the out-of-band blocker level is 20 dB higher than the in-band signal, the recommended RF gain should be at X dB. The RF gain reference table enables detection of out-of-band signals that may cause RF saturation but that were not detected by the peak detector 101. The RF gain reference table also indicates optimal RF gain settings to be able to successfully receive and decode RF signals with low in-band power in the presence of strong out-of-band signals. The flow continues at block 908.

At block 908, it is determined whether the current value of the RF gain is greater than the recommended RF gain. In one implementation, the gain change unit 108 compares the current RF gain with the recommended RF gain. If it is determined that the current value of the RF gain is greater than the recommended RF gain, the flow continues at block 910. If the gain change unit 108 determines that the current RF gain is less that the recommended RF gain, the gain change unit 108 does not vary the current RF gain and the flow ends.

At block 910, if the current RF gain is greater than the recommended RF gain, the current RF gain is decreased so that the RF gain is equal to the recommended RF gain. In one implementation, the gain change unit 108 decreases the current RF gain so that the RF gain equals the recommended RF gain. This is to ensure that RF gain takes into consideration any out-of-band signals that could interfere with packet reception and cause RF saturation after the gain is locked. In other words, the gain change unit 108 anticipates the presence of an interfering signal with the maximum allowable blocker signal level (as defined by IEEE specifications) and sets the RF gain of the RF front end to compensate for the interfering signal (if detected). From block 910, the flow ends.

It should be understood that the depicted diagrams (FIGS. 1-9) are examples meant to aid in understanding embodiments and should not be used to limit embodiments or limit scope of the claims. Embodiments may perform additional operations, fewer operations, operations in a different order, operations in parallel, and some operations differently. For example, although FIGS. 1-9 describe decreasing the RF gain in response to detecting RF saturation, in some implementations, e.g., in multi-chain chips, the RF gain may be dropped in all the receive chains if RF saturation is detected in one of the receive chains. In other words, for a chip with five receive chains, if RF saturation is detected in a first chain, but is not detected in the other receive chains, the RF gain of the first RF chain may be dropped by the RF gain drop value (determined in accordance with the RF gain table). Also, the RF gain in the four other receive chains may be dropped by a pre-determined gain drop value to pre-empt RF saturation in the other receive chains.

In some implementations, in addition to the peak detector 101 in the RF front end, multiple peak detectors (embodied as the peak detector 101 of FIG. 2) may be placed at various points in the receive chain. This can help identify processing units that are saturating so as to accordingly decrease RF gain. For example, the receive chain can comprise multiple mixer units and a peak detector may be implemented before every mixer unit in the receive chain. In one implementation, the outputs from each of the peak detectors in the receive chain may be multiplexed together and may be analyzed together to determine if and by how much the RF gain should be decreased. In another implementation, the output from each of the peak detectors may be analyzed individually to determine if and by how much the gain at each stage should be decreased.

Lastly, in some implementations, when Bluetooth and WLAN devices are collocated on a common chip and share a common receive antenna, the processing unit gain table may be split into two gain tables—one for WLAN device processing units and another for Bluetooth device processing units. This can ensure that processing unit gains of different devices are varied differently, based on the signal strength. For example, the gain of WLAN device processing units may be varied based on strength of a received WLAN signal, while the gain of Bluetooth device processing units may be varied based on strength of a received Bluetooth signal.

Embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments of the inventive subject matter may take the form of a computer program product embodied in any tangible medium of expression having computer usable program code embodied in the medium. The described embodiments may be provided as a computer program product, or software, that may include a machine-readable medium having stored thereon instructions, which may be used to program a computer system (or other electronic device(s)) to perform a process according to embodiments, whether presently described or not, since every conceivable variation is not enumerated herein. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions. In addition, embodiments may be embodied in an electrical, optical, acoustical or other form of propagated signal (e.g., carrier waves, infrared signals, digital signals, etc.), or wireline, wireless, or other communications medium.

Computer program code for carrying out operations of the embodiments may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN), a personal area network (PAN), or a wide area network (WAN), or the connection may be made to an external computer (for example, through the Internet using an Internet Service Provider).

Figure 10:
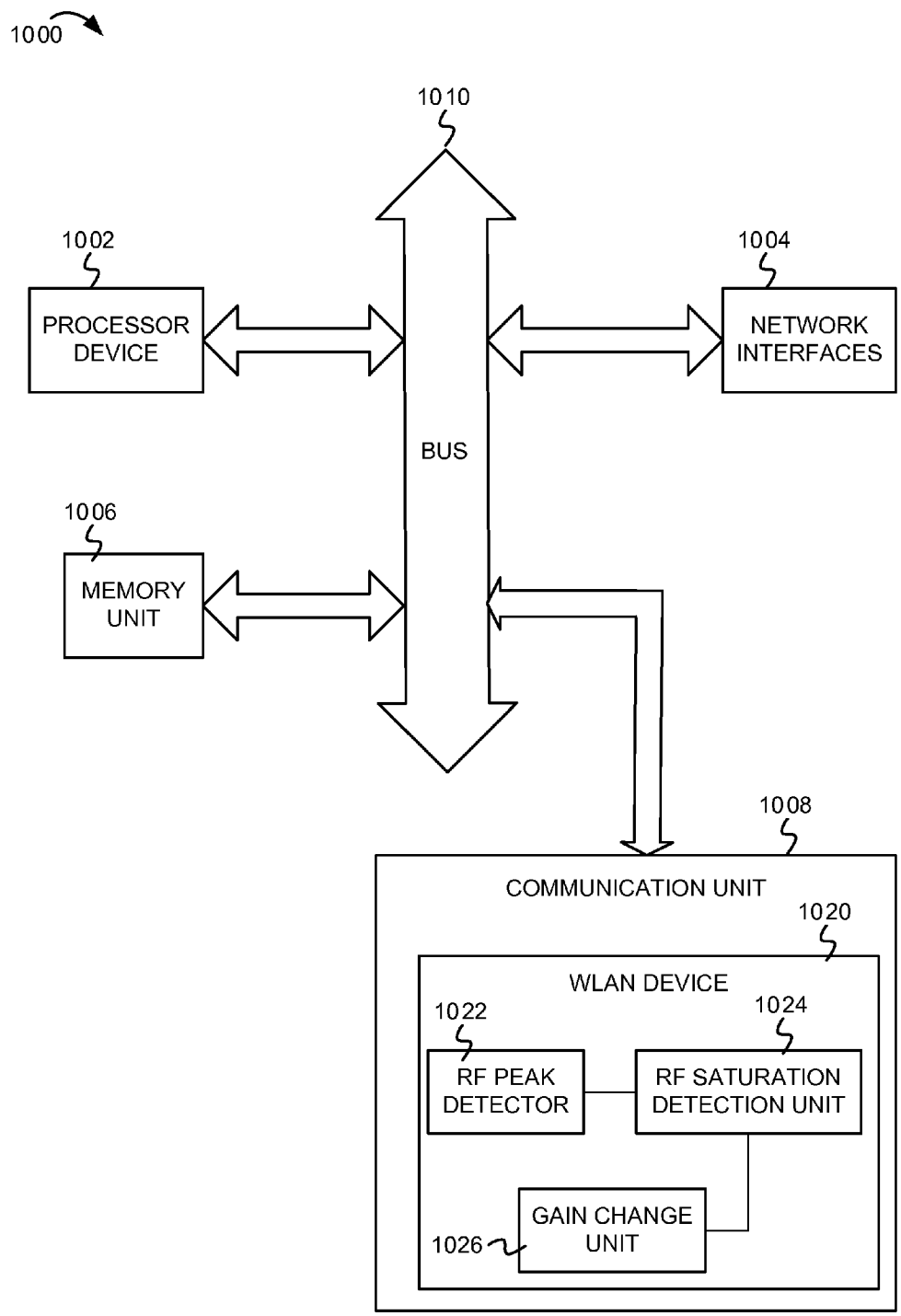
FIG. 10 is a block diagram of one embodiment of a computer system including detecting RF saturation in a WLAN device.

FIG. 10 is a block diagram of one embodiment of a computer system including a mechanism for detecting RF saturation in a WLAN device. In some implementations, the computer system 1000 may be one of a personal computer (PC), a laptop, a netbook, a mobile phone, a personal digital assistant (PDA), or other electronic systems comprising a WLAN device. The computer system 1000 includes a processor unit 1002 (possibly including multiple processors, multiple cores, multiple nodes, and/or implementing multi-threading, etc.). The computer system 1000 includes a memory unit 1006. The memory unit 1006 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system 1000 also includes a bus 1010 (e.g., PCI, ISA, PCI-Express, HyperTransport®, InfiniBand®, NuBus, etc.), and network interfaces 1004 that include at least one wireless network interface (e.g., a WLAN interface, a Bluetooth® interface, a WiMAX interface, a ZigBee® interface, a Wireless USB interface, etc.).

The computer system 1000 also includes a communication unit 1008. The communication unit 1008 comprises a WLAN device 1020. The WLAN device 1020 comprises an RF peak detector 1022, an RF saturation detection unit 1024, and a gain change unit 1026. The RF saturation detection unit 1024 is coupled to the RF peak detector 1022 and the gain change unit 1026. The RF peak detector and the RF saturation detection unit 1024 implement functionality to detect RF saturation, as described above with reference to FIGS. 1-5. The gain change unit 1026 implements functionality to vary gain of an RF front end and/or one or more other processing units, as described above with reference to FIGS. 6-9. Any one of these functionalities may be partially (or entirely) implemented in hardware and/or on the processing unit 1002. For example, the functionality may be implemented with an application specific integrated circuit, in logic implemented in the processing unit 1002, in a co-processor on a peripheral device or card, etc. Further, realizations may include fewer or additional components not illustrated in FIG. 10 (e.g., video cards, audio cards, additional network interfaces, peripheral devices, etc.). The processor unit 1002, the memory 1006, and the network interface 1004 are coupled to the bus 1010. Although illustrated as being coupled to the bus 1010, the memory 1006 may be coupled to the processor unit 1002.

While the embodiments are described with reference to various implementations and exploitations, it will be understood that these embodiments are illustrative and that the scope of the inventive subject matter is not limited to them. In general, techniques for automatic gain control techniques for detecting RF saturation as described herein may be implemented with facilities consistent with any hardware system or hardware systems. Many variations, modifications, additions, and improvements are possible.

Plural instances may be provided for components, operations, or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A method comprising:
   determining a plurality of samples, associated with an RF signal received at a wireless network device, that are used to indicate RF saturation in the wireless network device at a plurality of time instants;
   determining, in a window of a pre-determined subset of the plurality of samples, a number of high amplitude samples, wherein each of the high amplitude samples indicates a presence of RF saturation in the wireless network device at a time instant of the plurality of time instants;
   comparing the number of high amplitude samples in the window with a plurality of gain thresholds to determine whether to decrease an RF gain associated with the wireless network device;
   in response to determining to decrease the RF gain associated with the wireless network device, determining an RF gain drop value based, at least in part, on said comparing the number of high amplitude samples in the window with the plurality of gain thresholds; and
   decreasing the RF gain associated with the wireless network device in accordance with the RF gain drop value.

2. The method of claim 1, wherein said determining the plurality of samples that are used to indicate RF saturation in the wireless network device at the plurality of time instants further comprises:
   determining a baseband signal associated with the received RF signal;
   comparing an amplitude of the baseband signal with an amplitude threshold to determine whether the amplitude of the baseband signal is greater than the amplitude threshold;
   generating an output signal indicating the presence or absence of RF saturation in the wireless network device; and
   sampling the output signal to generate the plurality of samples that are used to indicate RF saturation in the wireless network device at the plurality of time instants.

3. The method of claim 2, wherein said generating the output signal indicating the presence or absence of RF saturation in the wireless network device further comprises:
   generating a high amplitude output signal in response to determining that the amplitude of the baseband signal is greater than the amplitude threshold, wherein the high amplitude output signal indicates the presence of RF saturation in the wireless network device;
   generating a low amplitude output signal in response to determining that the amplitude of the baseband signal is less than the amplitude threshold, wherein the low amplitude output signal indicates the absence of RF saturation in the wireless network device.

4. The method of claim 2, further comprising:
   subtracting a pre-determined DC level from the amplitude of the baseband signal to compensate for a DC offset.

5. The method of claim 1, wherein said comparing the number of high amplitude samples in the window with the plurality of gain thresholds to determine whether to decrease the RF gain associated with the wireless network device further comprises:
   determining whether the number of high amplitude samples is greater than a lower limit gain threshold;
   determining whether the number of high amplitude samples is greater than an intermediate gain threshold in response to determining that the number of high amplitude samples is greater than the lower limit gain threshold; and
   determining whether the number of high amplitude samples is greater than an upper limit gain threshold in response to determining that the number of high amplitude samples is greater than the intermediate gain threshold.

6. The method of claim 5, wherein said determining the RF gain drop value further comprises:
   maintaining the RF gain associated with the wireless network device in response to determining that the number of high amplitude samples is less than the lower limit gain threshold;
   determining the RF gain drop value based on the lower limit gain threshold in response to determining that the number of high amplitude samples is less than the intermediate gain threshold;
   determining the RF gain drop value based on the intermediate gain threshold in response to determining that the number of high amplitude samples is less than the upper limit gain threshold; and
   determining the RF gain drop value based on the upper limit gain threshold in response to determining that the number of high amplitude samples is greater than the upper limit gain threshold.

7. The method of claim 6, further comprising determining the RF gain drop value based on an RF gain table.

8. The method of claim 1, wherein said decreasing the RF gain associated with the wireless network device in accordance with the RF gain drop value further comprises:
   determining whether a current value of the RF gain associated with the wireless network device is at a minimum RF gain;
   decreasing the RF gain associated with the wireless network device in accordance with the RF gain drop value in response to determining that the current value of the RF gain associated with the wireless network device is not at the minimum RF gain;
   determining a processing unit gain drop value in response to determining that the current value of the RF gain associated with the wireless network device is at the minimum RF gain; and
   decreasing a gain of one or more processing units in accordance with the processing unit gain drop value, wherein the processing units comprise baseband processing units excluding an RF processing stage in the wireless network device.

9. The method of claim 1, further comprising:
   determining whether a gain delay interval is expired in response to determining to decrease the RF gain associated with the wireless network device, wherein the gain delay interval indicates a time interval for which the RF gain associated with the wireless network device should not be varied;
   maintaining the RF gain associated with the wireless network device in response to determining that the gain delay interval is not expired;
   decreasing the RF gain associated with the wireless network device in accordance with the RF gain drop value in response to determining that the gain delay interval is expired; and
   resetting the gain delay interval to prevent RF gain oscillation, in response to said decreasing the RF gain associated with the wireless network device.

10. The method of claim 1, further comprising:
- determining a power at an output of an analog to digital converter (ADC) in the wireless network device to yield an ADC power;
- determining whether the ADC power is below a pre-determined power threshold;
- determining whether a gain delay interval is expired in response to determining that the ADC power is below the power threshold, wherein the gain delay interval indicates a time interval for which the RF gain associated with the wireless network device should not be varied;
- incrementing the RF gain associated with the wireless network device in accordance with an RF gain increment in response to determining that the gain delay interval is expired; and
- maintaining the RF gain associated with the wireless network device in response to determining that the gain delay interval is not expired.

11. The method of claim 10, wherein said incrementing the RF gain associated with the wireless network device in accordance with an RF gain increment further comprises:
- determining whether said incrementing the RF gain associated with the wireless network device in accordance with an RF gain increment will cause the RF gain to exceed a maximum allowable RF gain;
- increasing the RF gain by the RF gain increment in response to determining that incrementing the RF gain associated with the wireless network device in accordance with the RF gain increment will not cause the RF gain to exceed the maximum allowable RF gain;
- increasing the RF gain by a difference RF gain in response to determining that incrementing the RF gain associated with the wireless network device in accordance with the RF gain increment will cause the RF gain to exceed the maximum allowable RF gain, wherein the difference RF gain is a difference between the maximum allowable RF gain and a current RF gain; and
- increasing a gain of one or more processing units in accordance with a processing unit gain increment in response to determining that incrementing the RF gain associated with the wireless network device in accordance with an RF gain increment will cause the RF gain to exceed the maximum allowable RF gain, wherein the processing unit gain increment is determined based, at least in part, on the difference RF gain and the RF gain increment.

12. The method of claim 1, further comprising:
- calculating a received signal strength indicator of the RF signal;
- determining a current value of the RF gain associated with the wireless network device;
- determining a reference RF gain based, at least in part, on said calculating the received signal strength indicator of the RF signal;
- determining whether the current value of the RF gain is greater than the reference RF gain; and
- decreasing the current value of the RF gain to be equal to or less than the reference RF gain in response to determining that the current value of the RF gain is greater than the reference RF gain.

13. A wireless network device comprising:
- a peak detector configured to:
  - determine a plurality of samples, associated with an RF signal received at the wireless network device, that are used to indicate RF saturation in the wireless network device at a plurality of time instants;
- a saturation detection unit configured to:
  - determine, in a window of a pre-determined subset of the plurality of samples, a number of high amplitude samples, wherein each of the high amplitude samples indicates a presence of RF saturation in the wireless network device at a time instant of the plurality of time instants;
- a gain change unit configured to:
  - compare the number of high amplitude samples in the window with a plurality of gain thresholds to determine whether to decrease an RF gain associated with the wireless network device;
  - in response to the gain change unit determining to decrease the RF gain associated with the wireless network device, determine an RF gain drop value based, at least in part, on the gain change unit comparing the number of high amplitude samples in the window with the plurality of gain thresholds; and
  - decrease the RF gain associated with the wireless network device in accordance with the RF gain drop value.

14. The wireless network device of claim 13, wherein the peak detector configured to determine the plurality of samples that are used to indicate RF saturation in the wireless network device at the plurality of time instants further comprises the peak detector configured to:
- determine a baseband signal associated with the received RF signal;
- compare an amplitude of the baseband signal with an amplitude threshold to determine whether the amplitude of the baseband signal is greater than the amplitude threshold;
- generate an output signal indicating the presence or absence of RF saturation in the wireless network device; and
- sample the output signal to generate the plurality of samples that are used to indicate RF saturation in the wireless network device at the plurality of time instants.

15. The wireless network device of claim 14, wherein the peak detector configured to generate the output signal indicating the presence or absence of RF saturation in the wireless network device further comprises the peak detector configured to:
- generate a high amplitude output signal in response to the peak detector determining that the amplitude of the baseband signal is greater than the amplitude threshold, wherein the high amplitude output signal indicates the presence of RF saturation in the wireless network device;
- generate a low amplitude output signal in response to the peak detector determining that the amplitude of the baseband signal is less than the amplitude threshold, wherein the low amplitude output signal indicates the absence of RF saturation in the wireless network device.

16. The wireless network device of claim 13, wherein the gain change unit configured to compare the number of high amplitude samples in the window with the plurality of gain thresholds to determine whether to decrease the RF gain associated with the wireless network device further comprises the gain change unit configured to:
- determine whether the number of high amplitude samples is greater than a lower limit gain threshold;
- determine whether the number of high amplitude samples is greater than an intermediate gain threshold in response to the gain change unit determining that the number of high amplitude samples is greater than the lower limit gain threshold; and determine whether the number of high amplitude samples is greater than an upper limit gain threshold in response to the gain change unit determining that the number of high amplitude samples is greater than the intermediate gain threshold.

17. The wireless network device of claim 16, wherein the gain change unit configured to determine the RF gain drop value further comprises the gain change unit configured to:

maintain the RF gain associated with the wireless network device in response to the gain change unit determining that the number of high amplitude samples is less than the lower limit gain threshold;

determine the RF gain drop value based on the lower limit gain threshold in response to the gain change unit determining that the number of high amplitude samples is less than the intermediate gain threshold;

determine the RF gain drop value based on the intermediate gain threshold in response to the gain change unit determining that the number of high amplitude samples is less than the upper limit gain threshold; and determine the RF gain drop value based on the upper limit gain threshold in response to the gain change unit determining that the number of high amplitude samples is greater than the upper limit gain threshold.

18. The wireless network device of claim 13, wherein the gain change unit configured to decrease the RF gain associated with the wireless network device in accordance with the RF gain drop value further comprises the gain change unit configured to:

determine whether a current value of the RF gain associated with the wireless network device is at a minimum RF gain;

decrease the RF gain associated with the wireless network device in accordance with the RF gain drop value in response to the gain change unit determining that the current value of the RF gain associated with the wireless network device is not at the minimum RF gain;

determine a processing unit gain drop value in response to the gain change unit determining that the current value of the RF gain associated with the wireless network device is at the minimum RF gain; and decrease a gain of one or more processing units in accordance with the processing unit gain drop value, wherein the processing units comprise baseband processing units excluding an RF processing stage in the wireless network device.

19. The wireless network device of claim 13, further comprising the gain change unit configured to:

determine whether a gain delay interval is expired in response to the gain change unit determining to decrease the RF gain associated with the wireless network device, wherein gain delay interval indicates a time interval for which the RF gain associated with the wireless network device should not be varied;

maintain the RF gain associated with the wireless network device in response to the gain change unit determining that the gain delay interval is not expired;

decrease the RF gain associated with the wireless network device in accordance with the RF gain drop value in response to the gain change unit determining that the gain delay interval is expired; and reset the gain delay interval to prevent RF gain oscillation, in response to the gain change unit decreasing the RF gain associated with the wireless network device.

20. One or more machine-readable media having stored therein instructions, which when executed by one or more processor units causes the one or more processor units to perform operations that comprise:

determining a plurality of samples, associated with an RF signal received at a wireless network device, that are used to indicate RF saturation in the wireless network device at a plurality of time instants;

determining, in a window of a pre-determined subset of the plurality of samples, a number of high amplitude samples, wherein each of the high amplitude samples indicates a presence of RF saturation in the wireless network device at a time instant of the plurality of time instants;

comparing the number of high amplitude samples in the window with a plurality of gain thresholds to determine whether to decrease an RF gain associated with the wireless network device;

in response to determining to decrease the RF gain associated with the wireless network device, determining an RF gain drop value based, at least in part, on said comparing the number of high amplitude samples in the window with the plurality of gain thresholds; and decreasing the RF gain associated with the wireless network device in accordance with the RF gain drop value.

21. The machine-readable media of claim 20, wherein said operation of determining the plurality of samples that are used to indicate RF saturation in the wireless network device at the plurality of time instants further comprises:

determining a baseband signal associated with the received RF signal;

comparing an amplitude of the baseband signal with an amplitude threshold to determine whether the amplitude of the baseband signal is greater than the amplitude threshold;

generating an output signal indicating the presence or absence of RF saturation in the wireless network device; and sampling the output signal to generate the plurality of samples that are used to indicate RF saturation in the wireless network device at the plurality of time instants.

22. The machine-readable media of claim 20, wherein said operation of comparing the number of high amplitude samples in the window with the plurality of gain thresholds to determine whether to decrease the RF gain associated with the wireless network device further comprises:

determining whether the number of high amplitude samples is greater than a lower limit gain threshold;

determining whether the number of high amplitude samples is greater than an intermediate gain threshold in response to determining that the number of high amplitude samples is greater than the lower limit gain threshold; and determining whether the number of high amplitude samples is greater than an upper limit gain threshold in response to determining that the number of high amplitude samples is greater than the intermediate gain threshold.

23. The machine-readable media of claim 22, wherein said operation of determining the RF gain drop value further comprises:

maintaining the RF gain associated with the wireless network device in response to determining that the number of high amplitude samples is less than the lower limit gain threshold;

determining the RF gain drop value based on the lower limit gain threshold in response to determining that the number of high amplitude samples is less than the intermediate gain threshold;

determining the RF gain drop value based on the intermediate gain threshold in response to determining that the number of high amplitude samples is less than the upper limit gain threshold; and determining the RF gain drop value based on the upper limit gain threshold in response to determining that the number of high amplitude samples is greater than the upper limit gain threshold.

* * * * *